(12) United States Patent
Psyk

(10) Patent No.: US 8,021,913 B2
(45) Date of Patent: Sep. 20, 2011

(54) METHOD AND APPARATUS FOR FORMING THE SEPARATING LINES OF A PHOTOVOLTAIC MODULE WITH SERIES-CONNECTED CELLS

(76) Inventor: Walter Psyk, Munich (DE)

( * ) Notice: Subject to any disclaimer, the term of this patent is extended or adjusted under 35 U.S.C. 154(b) by 287 days.

(21) Appl. No.: 12/381,529

(22) Filed: Mar. 12, 2009

(65) Prior Publication Data

US 2009/0233397 A1 Sep. 17, 2009

(30) Foreign Application Priority Data

Mar. 13, 2008 (DE) .................. 10 2008 014 263

(51) Int. Cl.
 *H01L 21/00* (2006.01)
(52) U.S. Cl. .................. 438/80; 257/E21.347
(58) Field of Classification Search .................. 438/68; 257/E21.475
See application file for complete search history.

(56) References Cited

U.S. PATENT DOCUMENTS

| 6,300,593 B1 | 10/2001 | Powell | |
|---|---|---|---|
| 6,455,347 B1 * | 9/2002 | Hiraishi et al. | 438/80 |
| 7,259,321 B2 * | 8/2007 | Oswald et al. | 136/244 |

FOREIGN PATENT DOCUMENTS

WO   WO 2007/144565 A2   12/2007

* cited by examiner

*Primary Examiner* — Chandra Chaudhari
(74) *Attorney, Agent, or Firm* — Miller Canfield Paddock & Stone; Mark L. Maki

(57) ABSTRACT

For forming the separating lines, (5, 6, 7) which are produced in the functional layers (2, 3, 4) deposited on a transparent substrate (1) during manufacture of a photovoltaic module with series-connected cells (C1, C2, . . . ), there are used laser scanners (8) whose laser beam (14) produces in the field (17) scanned thereby a plurality of adjacent separating line sections (18) in the functional layer (2, 3, 4). The laser scanners (8) are then moved relative to the coated substrate (1) in the direction (Y) of the separating lines (5, 6, 7) by a distance corresponding at the most to the length (L) of the scanned field (17) to thereby form continuous separating lines (5, 6, 7) through mutually flush separating line sections (18).

5 Claims, 3 Drawing Sheets

Figure 1:
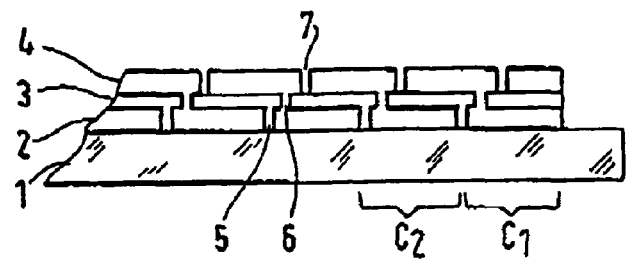

METHOD AND APPARATUS FOR FORMING THE SEPARATING LINES OF A PHOTOVOLTAIC MODULE WITH SERIES-CONNECTED CELLS

This invention relates to a method for forming the separating lines that are formed in the functional layers on the transparent substrate during manufacture of a photovoltaic module with series-connected cells, according to the preamble of claim 1. It also relates to an apparatus for carrying out the method.

During manufacture of a photovoltaic module there are deposited over the entire surface on the electrically insulating transparent substrate, normally a glass plate, the transparent front electrode layer, the semiconductor layer and the back electrode layer which constitute the functional layers of the module.

The individual monolithic layers are patterned by separating lines e.g. with a laser so as to form series-connected strip-shaped cells. The generated current is collected by contacting the two outermost cells. It is thus possible to realize thin-film modules with different voltages, e.g. for 12 V consumers.

For patterning, the coated substrate is typically disposed on a table movable in the X and Y directions. It is instead possible to use a movable gantry with the laser or a table movable in the Y direction and a stationary gantry with a laser movable in the X direction (a so-called "split-axis system"), which will hereinafter be representative of the other systems in describing the prior art.

In the split-axis system, at least one laser beam is focused into the thin functional layers with at least one focusing optic movable along a gantry in the X direction, i.e. perpendicular to the separating lines to be formed. Motion of the coated substrate under the focusing optic in the Y direction, i.e. in the direction of the separating line to be formed, then causes the separating line to be formed in the functional layer by the focused laser beam.

The separating lines reduce the photovoltaically active area by their surface area and thus do not contribute to converting sunlight to electrical energy. It is therefore necessary to make the separating lines narrow, whereby they typically have a width of 50 μm. Also, the distances between the separating lines, which must be counted as lost areas, should be as small as possible to minimize the total area lost through the integrated series connection. This results in high demands on the precision or tolerances of the patterning system. For example, if two adjacent separating lines are 100 μm apart and said lines are typically 50 μm wide, they may touch each other at the most but must not overlap, a tolerance or precision of +/−25 μm for the patterning system is necessary. If a module has for example 160 series-connected cells, 160 separating lines are necessary per functional layer. For a module with a size of for example approx. 1.4 m² (e.g. 1100 mm×1300 mm), there are thus 40 motions required in the ideal case for example with four focusing optics on the gantry.

At an annual capacity of for example 90,000 coated substrates per patterning system, this then results in 3.6 million motions per patterning system, which are carried out at an extremely fast motion speed, typically 1200 mm/s. In such an oscillating motion system, the acceleration times and the feed motions of the focusing optics to the next separating line must also be taken into account.

The constructions for said patterning systems are therefore elaborate, heavy and cost-intensive. At for example 160 separating lines on a 1300 mm long substrate, four focusing optics, a motion speed of 1200 mm/s, an acceleration of 2 g and a feed time in the X direction of 0.3 s, the resulting processing time for the module is approx. 60 seconds. In addition there are typically approx. another 30 seconds per laser processing step for loading and unloading, fixing, and position detection of the coated substrate for example by image processing.

To increase throughput with the same precision or tolerance of the patterning system, it is possible not only to increase the number of focusing optics but also to increase the motion speed of the patterning system, but this makes the constructions substantially more complex, larger, heavier and costlier.

The industrial manufacture of a photovoltaic module requires a plurality of costly machines. The machine for semiconductor coating usually involves the highest investment costs. In addition, the above-mentioned laser machines are important cost factors.

The capacity of the semiconductor coating machine and the capacity of the laser machines are usually different. Being the costliest machine, the semiconductor coating machine is generally utilized at a rate of 100%.

If the semiconductor coating machine performs for example a coating of 210,000 modules per annum at the most, and each patterning machine per functional layer (front electrode layer, semiconductor layer, back electrode layer) is designed for 90,000 modules per annum, this has the consequence that altogether nine costly laser machines must be procured. The number of laser machines therefore leads to a considerable cost problem in the industrial manufacture of photovoltaic modules.

It is therefore the object of the invention to provide a method and apparatus permitting the costs to be considerably reduced for forming the separating lines in the functional layers in the industrial manufacture of photovoltaic modules.

This is achieved according to the invention by the method characterized in claim 1. The subclaims 2 to 5 present advantageous embodiments of the inventive method.

According to the invention, the laser used is at least one laser scanner whose laser beam produces in the field scanned thereby a plurality of adjacent separating line sections in the functional layer, the laser scanner being moved relative to the coated substrate, after scanning the field, in order to form continuous separating lines extending over the total length of the module through mutually flush separating line sections.

The relative motion of laser scanner and coated substrate is preferably effected in the direction of the separating lines by a distance corresponding at the most to the length of the scanned field. The direction of relative motion can be the Y or X direction.

The transparent front electrode layer can consist of an electrically conductive metal oxide, for example tin oxide (SnO2), zinc oxide (ZnO) or another material. The semiconductor layer can consist of silicon, for example amorphous, nano-, micro- or polycrystalline silicon, but also of other semiconductors, for example cadmium tellurium or copper indium gallium selenide (CIGS). The back electrode layer is preferably a metal layer, consisting for example of aluminum, copper, silver or the like. Alternatively, a non-transparent substrate can also be used.

The substrate can be formed by a glass plate or another transparent, electrically insulating material.

The at least one laser scanner is disposed on a holder which is movable by a device relative to a receiving means for the coated substrate.

The laser beam of the laser scanner scans a field or a focusing surface with a size of preferably at least 100 cm² on the functional layer that is to be provided with the separating line. For this purpose, the laser scanner is provided with at least one mirror which guides the laser beam onto the functional layer.

To produce a line, i.e. a section of the separating line in the field, the mirror is preferably rotated with a galvanometer drive. After producing the individual line or separating line section in the field, the laser beam must be aligned with the next line in order to produce the next parallel separating line section in said field.

This means that the mirror must then be deflected first in the X direction, i.e. in a direction extending transversely or perpendicular to the separating line direction, by a distance corresponding to the distance between two adjacent separating lines, before the next separating line section is produced in said field.

Preferably, the laser scanner has for this purpose in each case two mirrors movable orthogonally to each other which reflect the laser beam and are preferably driven by a galvanometer drive.

In this way it is possible to produce with the scanner software a multiplicity of parallel adjacent separating line sections in the field in question.

This means that the at least one laser scanner can be moved in the X direction relative to the coated substrate by a distance corresponding at the most to the width of the scanned field until the coated substrate is provided with the adjacent separating line sections across its total width. Subsequently, laser scanner and substrate are moved relative to each other by at the most one field length in order to form the next row of separating line sections extending in the X direction which are connected to the previously formed separating sections, etc.

It is possible to shift the at least one laser scanner on the holder, i.e. for example on a gantry extending over the coated substrate, in the X direction by a distance corresponding to the width of the field in order to form the separating line sections in the field adjoining in the X direction.

However, it is also possible to provide a plurality of laser scanners on such a gantry side by side, resulting in a row of laser scanners extending transversely across the substrate, i.e. one field follows the other, all fields of a row being lasered by the particular laser scanners simultaneously.

In this way it is possible to produce separating line sections extending in the Y direction in the functional layer across the total width of the substrate with a motion of the substrate relative to the row of laser scanners. In the next step, the substrate and the row of laser scanners are moved relative to each other by one field length at the most to thereby extend the separating line sections step by step until the individual mutually flush separating line sections form the continuous separating lines in said functional layer.

It is essential that when a plurality of adjacent laser scanners are used, the width of the field scanned by one laser scanner is dimensioned in the X direction such that it is at the most one separating line spacing away from the field scanned by the adjacent laser scanner. However, an overlap of the fields is preferably effected.

In particular, an overlap of the field is necessary when the separating lines extend in the functional layers not in the Y direction of the coated substrate, but in the X direction thereof, i.e. not in the longitudinal direction of a rectangular substrate, but transversely. For this purpose, the laser scanners on the gantry form continuous separating lines extending across the total width of the coated substrate or in the X direction. There is then effected a relative motion of the laser scanners and of the substrate in the Y direction by a distance corresponding at the most to the width of the fields of the laser scanners, optionally plus one separating line spacing, whereupon the laser scanners again form continuous separating lines extending across the total width of the coated substrate or in the X direction. This process is repeated until the coated substrate is provided with the separating lines over its total length, i.e. also in the Y direction.

Such a laser scanner can produce the separating line sections at a high speed of preferably at least 1 m/s, in particular at least 5 m/s. The fields scanned by the laser beam for producing the separating line sections preferably each have an area of at least $100 \times 100$ mm$^2$.

When a plurality of laser scanners are provided, they can be so disposed that the areas scanned thereby adjoin each other in the X direction and are mutually flush. However, it is also possible to dispose the adjacent laser scanners on the holder so as to be offset in the direction of the separating lines, i.e. the Y direction, such that a laser scanner offset in one direction is aligned in staggered relationship with two laser scanners offset in the other direction.

The inventive apparatus can be configured both as a gantry system and as a split-axis system.

This means that the holder for the at least one laser scanner can be formed by a gantry movable in the Y direction, as in the gantry system. Instead, the receiving means for the coated substrate can be formed by a table movable in the Y direction, as in the split-axis system, while the holder comprises a stationary gantry on which the laser scanner or scanners are disposed so as to be movable in the X direction.

It is not necessary for each laser scanner to possess a separate laser source. Rather, the laser beam of the laser source can be split into partial beams, with each partial beam being reflected by the at least one mirror of the laser scanner in order for said laser scanner to scan the field associated therewith. This means that if the laser source is powerful, the laser beam can be split in order for a partial beam to then produce the separating line sections of the particular field.

It is preferable to use a neodymium-doped solid-state laser, in particular a neodymium-doped yttrium vanadate laser (Nd:YVO4 laser) or neodymium-doped yttrium aluminum garnet laser (Nd:YAG laser) with a fundamental wavelength of 1064 nm or the second harmonic wavelength of 532 nm or the third harmonic wavelength of 335 nm.

The loading and unloading of the substrate can be effected from the same side of the inventive function layer patterning apparatus. However, it is preferable to provide a device for transporting the coated substrate received by the receiving means from a loading station on one side of the inventive function layer patterning apparatus or processing station to an unloading station on the other side of the apparatus.

The transport device can be an endless conveying device which is provided with a receiving means with a fixing device, for example a clamping device, for the coated substrate, but it can also be formed by another device which moves the receiving means on which the coated substrate is fixed e.g. with a clamping device from the loading station over the patterning apparatus to the unloading station.

The coated substrate can be loaded into the loading station for example with a multi-axis robot such that after fixation of the substrate the laser beam is focused directly into the functional layer during the patterning process, or if the substrate is loaded and fixed at a 180° tilt, the laser beam is focused into the thin functional layer through the transparent substrate. The patterning process is preferably carried out with the substrate standing on end, through which the laser beam is focused into the functional layer.

After fixation in the loading station, the substrate is transported by the trans-port device into the patterning apparatus or processing station, and fixed.

For position detection and adjustment of the coated substrate in the loading station there can be provided for example two cameras which determine the position of the substrate with image-processing software. A mechanism integrated in the patterning apparatus can then parallelize the substrate with the coordinate system of the software by rotating the substrate. The offset in the X and Y directions is calculated into the software, for example, and the coordinate system of the software shifted accordingly in X and Y. The parallelization of the substrate can also be effected, as an alternative to mechanical rotation of the substrate, by rotation of the coordinate system of the software. The substrate is thus adjusted in the patterning apparatus or processing station.

Figure 2:
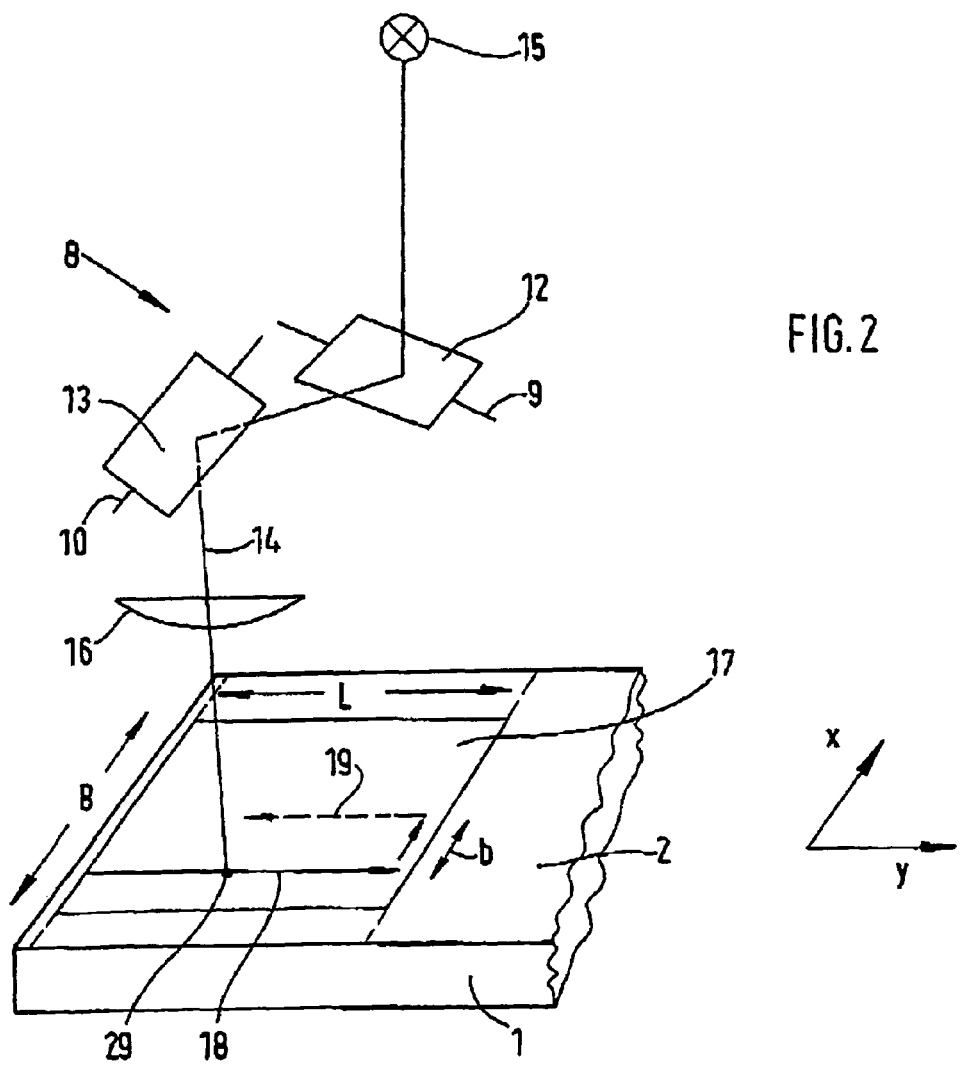
Figure 3:
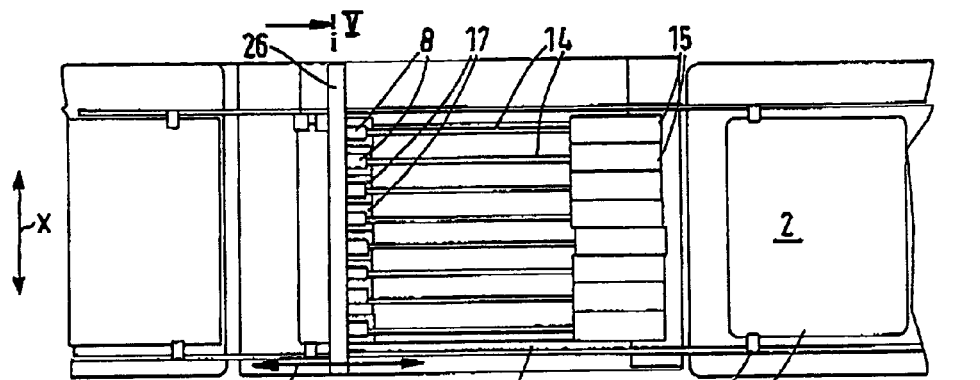
Figure 4:
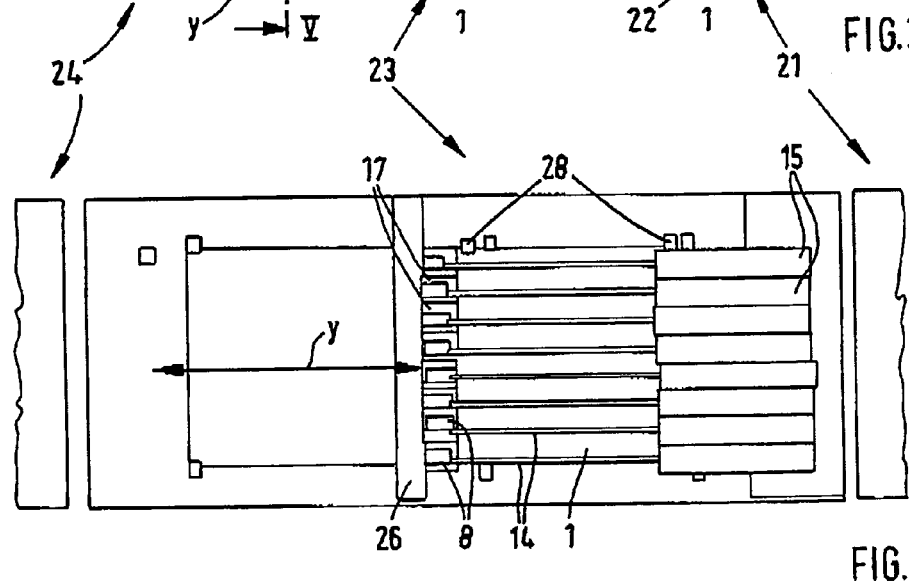
Figure 5:
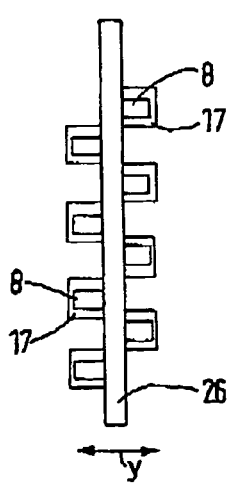
Figure 6:
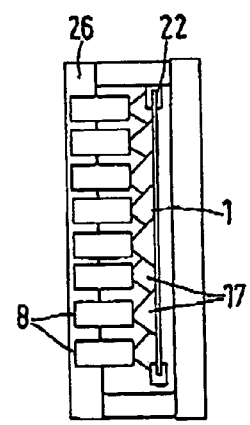
Figure 7:
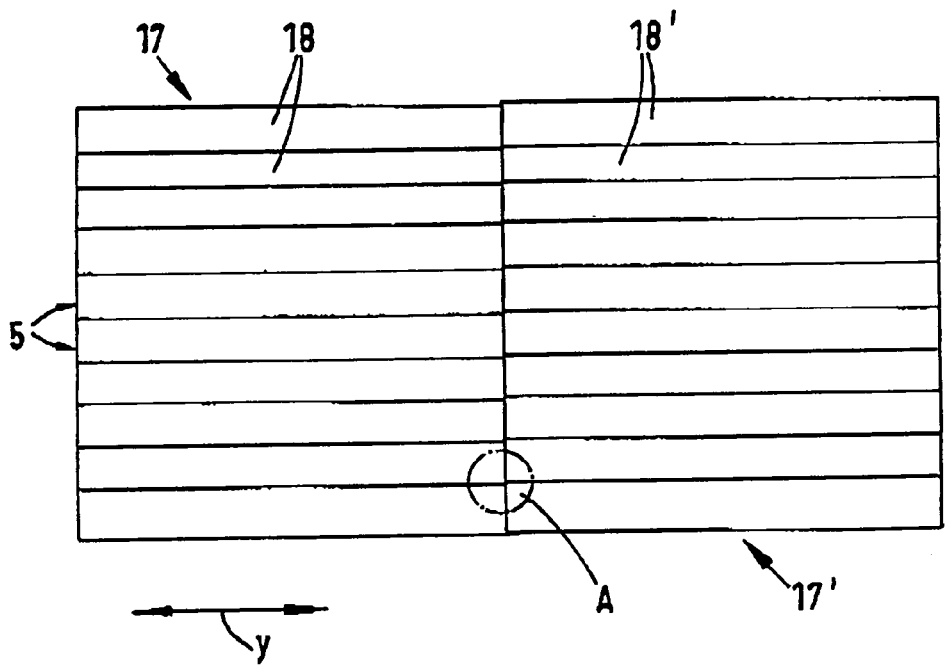

Hereinafter the invention will be explained more closely by way of example with reference to the enclosed drawing. Therein is shown schematically:

FIG. 1 a section through a part of a photovoltaic module substrate provided with series-connected cells, the functional layers being shown greatly enlarged;

FIG. 2 a perspective view of a laser scanner and of a part of the coated substrate;

FIGS. 3 and 4 the front view of a machine according to the gantry system or split-axis system for producing the separating lines in a functional layer of the substrate;

FIG. 5 the front view of a gantry with offset laser scanners;

FIG. 6 a cross section along the line V-V in FIG. 3;

FIG. 7 a plan view of two fields adjacent in the Y direction; and

Figure 8:
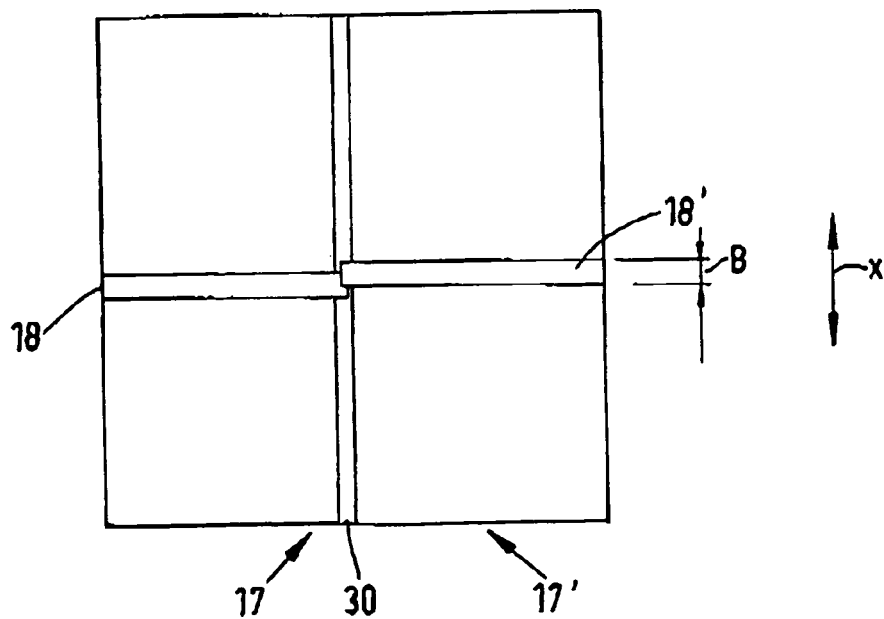

FIG. 8 an enlarged representation of the area A in FIG. 7.

According to FIG. 1, a transparent substrate 1, for example a glass plate, has a transparent front electrode layer 2, a semiconductor layer 3 and a back electrode layer 4.

The functional layers 2, 3 and 4 are provided with separating lines 5, 6, 7 to form series-connected strip-shaped cells C1, C2, . . . .

The separating lines 5, 6, 7 are produced with laser scanners 8.

According to FIG. 2, the laser scanner 8 has two mirrors 12, 13 rotatable around the orthogonal axes 9, 10 for reflecting the laser beam 14 from the laser source 15 to a focusing optic 16 for focusing the laser beam 14 on the functional layer, for example the front electrode layer 2.

As shown in FIG. 2, the laser beam 14 of each laser scanner 8 scans a focusing surface or field 17, e.g. with a length L of 150 mm and a width B of 150 mm, on the functional layer 2 which is to be provided with the separating lines 5 extending in the Y direction (FIG. 7).

For this purpose, the laser scanner 8 is provided with the two mirrors 12, 13 each operable by a galvanometer drive (not shown).

Laser scanners with a scanning head as shown by "8" in FIG. 2 are known. It is also common to use a galvanometer drive ("galvo" for short) for rotating the mirrors.

To produce a line, i.e. a section 18 (FIG. 2) of a separating line 5 in the field 17, the mirror 12 is rotated and thereby the laser beam 14 deflected in the Y direction.

After producing in the field 17 the separating line section 18 extending over the total length L of the field 17 in FIG. 2, the laser beam 14 must be guided onto the next line 19 shown by a dashed line in FIG. 2 in order to produce the next parallel separating line section in the field 17.

For this purpose, the mirror 13 is first rotated and thus the laser beam 14 guided in the X direction perpendicular to the Y direction by the distance b which corresponds to the spacing of two adjacent separating lines 5 in the functional layer 2. The mirror 12 is then operated again, thereby forming in the line 19 the next separating line section extending over the total length of the field 18. This process is repeated until the field 17 is provided with separating line sections 18 across its total width B.

According to FIGS. 3 and 4, a machine for forming the separating lines 5, 6, 7 has a loading station 21 on which the substrate 1 coated for example with the front electrode layer 2 is fixed on end, optionally also obliquely, with a receiving means 22 formed by a clamping device.

From the loading station 21 the substrate 1 is moved in the Y direction to the processing station 23 where the separating lines 5 are produced in the layer 2, and from there to the unloading station 24 on the other side of the processing station 23.

The processing station 23 has eight laser scanners 8 each with one laser source 15. The eight laser scanners 8 are disposed on a holder 26 configured as a gantry and thus extend in a row transversely, i.e. in the X direction, across the substrate 1 to be processed whose layer 2 is to be provided with the separating lines 5.

Each laser scanner 8 according to FIGS. 3 and 4 is constructed substantially as described in connection with FIG. 2. This means that all eight laser scanners 8 simultaneously provide the field 17 located therebelow with separating line sections 18 extending over the total length L of each field 17. The individual fields 17 under the laser scanners 8 adjoin each other in the Y direction. Thus, the substrate 1 is provided across its total width with parallel separating line sections 18 disposed in a row which have a length L corresponding to the fields 17.

In the next step, the laser scanners 8 must be moved relative to the substrate 1 in the Y direction, by a distance corresponding at the most to the length L of the fields 17.

Then the laser scanners 8 form a second row of parallel separating line sections 18 extending across the total width of the substrate 1. This process is repeated until the separating line sections 18 of the individual rows form continuous separating lines 5 extending in the Y direction over the total length of the substrate 1 in the layer 2.

It should be noted that the distance by which the laser scanners 8 are moved in the Y direction upon each step is somewhat smaller than the length of the fields 17 in order to obtain an overlap of the fields 17 in the Y direction. In order for continuous separating lines to be formed, it is further required that the individual separating line sections 18 of each separating line 5 are mutually flush.

This is shown more closely in FIGS. 7 and 8. FIG. 7 shows two fields 17, 17' adjoining each other in the Y direction, with the separating lines 5 which are formed by the separating line sections 18, 18' of adjacent fields 17, 17'.

If the width B' of the separating lines is e.g. 50 µm, a precision of ±25 µm in the X direction must be maintained, and continuous separating lines 18, 18' are formed by an overlap 30

While the holder 26 configured as a gantry is moved in the Y direction in the gantry system shown in FIG. 3 for relative motion of the laser scanners 8 and of the substrate 1, the substrate 1 is moved in the Y direction in the split-axis system shown in FIG. 4 with the holder 26 stationary.

As shown in FIG. 5, the laser scanners 8 can also be disposed on the holder 26 so as to be offset in the Y direction, such that a laser scanner 8 offset in one Y direction, e.g. to the left, is aligned in staggered relationship with two laser scanners 8 offset in the other Y direction, i.e. to the right.

As indicated by FIG. 6, the layer to be processed, for example the front electrode layer 2, must be disposed exactly in the focusing plane of the laser scanners 8. For this purpose, two cameras 28 are disposed on the processing station 23 so that a position detection and thus adjustment of the substrate 1 in the processing station 23 is possible by image processing.

In the above-described exemplary embodiment, the X-axis of the gantry system according to FIG. 3 has eight adjacent laser scanners 8, with adjacent focusing fields 17 preferably overlapping by a few millimeters. For a substrate 1 with e.g. 1300 mm length in the Y direction, nine steps are required for patterning the substrate 1 with a size of for example 1.4 m² at an area of the focusing field of 150×150 mm² per laser scanner 8.

In doing so, for example twenty separating line sections 18 can be produced side by side in a field 17, so that 160 separating line sections 18 can be lasered with the eight laser scanners 8 in one step. A high motion speed of the laser focal point 29 (FIG. 2) can be obtained by the mirrors 12, 13 of 1200 mm/s for example. The acceleration time is very short and can therefore be neglected. The feed of the holder 26 or of the substrate 1 in the Y direction can be for example 0.5 seconds per step, so that for a 1.4 m² module the processing time for all separating lines of one layer is only 27 seconds, as opposed to e.g. approx. 90 seconds according to the prior art.

Moreover, the motion speed of the focal point 29 can be considerably increased without any additional constructional effort. The limit of the motion speed of the focal point is determined only by the quality of the laser process. This means that the motion speed can also be, instead of 1200 mm/s, for example 4000m/s and more, thereby permitting the processing time to be reduced to 9 seconds or less.

When the machine is designed as a continuous flow system according to FIGS. 3 and 4, the loading of the substrate 1 can furthermore be effected on one side of the processing station 23 and the unloading of the substrate 1 on the other side thereof, whereby the fixing of the substrate 1 can be carried out in the upstream loading station 21 and the release of the substrate 1 in the unloading station 24, so that the additional time to be taken into account is only the time for transporting the substrate 1 from the loading station 21 to the processing station 23 and the time for position detection and adjustment of the substrate 1 in the processing station 23. However, these two times are only approx. 5 seconds for transport and approx. 8 seconds for position detection and adjustment, i.e. only about 13 seconds.

Through exact calibration in the Y and X directions in the focal plane of the laser scanners 8 and the drift and offset compensation of the galvanometer scanner technology, the overlap of the separating line sections 18 lasered per field 17 can be effected in the single-digit μm range.

Thus, the processing time for forming the separating lines 5, 6, 7 can be reduced by more than 70% at low additional cost for equipment.

Patterning has been explained hereinabove in the Y direction, i.e. in the longitudinal direction of the rectangular substrate 1. However, separating lines and thus separating line sections can also extend in the X direction, e.g. across the total width of the coated substrate. For this purpose, the laser scanners 8 form in one step continuous separating lines extending across the total width, i.e. length of the substrate 1 in the X direction. Then there is effected a relative motion of the laser scanners 8 and of the substrate 1 in the Y direction by at the most a distance corresponding to the length L of the fields 17, whereupon the laser scanners 8 again form continuous separating lines extending across the total width of the functional layer of the substrate 1, etc.

The invention claimed is:

1. A method for forming separating lines during manufacture of a photovoltaic module with series-connected cells, whereby the separating lines are produced in the transparent front electrode layer, the semiconductor layer and/or the back electrode layer, which are deposited on a substrate as functional layers, with laser scanners each with a rotatable mirror and laser beam during manufacture of a photovoltaic module with series-connected cells, the laser scanners producing adjacent separating line sections in adjacent fields in the functional layer or layers by deflection of the laser beam with the rotatable mirror, and the laser scanners and the coated substrate are moved relative to each other along the separating lines to be formed in order to produce further adjacent separating line sections in the functional layer or layers, so that continuous separating lines are formed from the separating line sections, characterized in that the laser beam, after producing a separating line section in the particular field, is so aligned with the mirror that it produces the next parallel separating line in the field, and a plurality of the laser scanners adjacent in the transverse direction (X) to the separating lines are used, whereby the width (B) of the field scanned by each laser scanner is dimensioned in the transverse direction (X) to the separating lines such that it is at the most one separating line spacing away from the field scanned by the adjacent laser scanner.

2. The method according to claim 1, characterized in that the laser scanner, after scanning the particular field, is moved relative to the coated substrate in the direction (Y) of the separating lines by a distance corresponding at the most to the length (L) of the scanned field in the direction of the separating lines.

3. The method according to claim 1, characterized in that the at least one laser scanner is moved relative to the coated substrate in the transverse direction (X) transverse to the direction (Y) of the separating lines by a distance corresponding at the most to the width (B) of the scanned field until the coated substrate is provided with the adjacent separating line sections across its total width.

4. The method according to claim 2, characterized in that the length (L) or width (B) of the field scanned by each laser scanner in the direction (Y) of the separating lines or transverse direction (X) is at least 100 mm.

5. The method according to claim 1, characterized in that the laser beam scans the coated substrate at a speed of at least 1 m/s.

* * * * *